(12) United States Patent
Yeom et al.

(10) Patent No.: US 10,503,035 B2
(45) Date of Patent: Dec. 10, 2019

(54) DISPLAY DEVICE

(71) Applicant: LG Display Co., Ltd., Seoul (KR)

(72) Inventors: Jimin Yeom, Yeosu-si (KR);
ByoungHee Kim, Paju-si (KR);
Junguk Kim, Seoul-si (KR)

(73) Assignee: LG Display Co., Ltd., Seoul (KR)

( * ) Notice: Subject to any disclaimer, the term of this patent is extended or adjusted under 35 U.S.C. 154(b) by 108 days.

(21) Appl. No.: 15/682,106

(22) Filed: Aug. 21, 2017

(65) Prior Publication Data

US 2018/0180913 A1    Jun. 28, 2018

(30) Foreign Application Priority Data

Dec. 28, 2016  (KR) .................. 10-2016-0181588

(51) Int. Cl.
*G02F 1/1333*  (2006.01)
*G02F 1/1362*  (2006.01)
*H01L 27/12*   (2006.01)

(52) U.S. Cl.
CPC .. *G02F 1/136204* (2013.01); *G02F 1/136286*
(2013.01); *H01L 27/124* (2013.01)

(58) Field of Classification Search
None
See application file for complete search history.

(56) References Cited

U.S. PATENT DOCUMENTS

| | | | |
|---|---|---|---|
| 2006/0119757 A1* | 6/2006 | Tsao | G02F 1/136204 349/40 |
| 2007/0296881 A1* | 12/2007 | Choi | G02F 1/136204 349/40 |
| 2018/0047752 A1* | 2/2018 | Du | H01L 27/124 |

* cited by examiner

*Primary Examiner* — Richard H Kim
(74) *Attorney, Agent, or Firm* — Polsinelli PC

(57) ABSTRACT

The present aspect relates to a liquid crystal display device including an antistatic structure. In the liquid crystal display device including a first electrostatic discharge (ESD) circuit to prevent static electricity generated from the common voltage pattern and a second ESD circuit to prevent static electricity generated from a data line, the first ESD circuit is floated from a common voltage line and is electrically connected to a common voltage jumping pattern which connects the common voltage line with a common electrode, thereby preventing static electricity generated from the common voltage pattern from flowing into the data line.

20 Claims, 9 Drawing Sheets

DISPLAY DEVICE

CROSS REFERENCE TO RELATED APPLICATION

This application claims priority from Korean Patent Application No. 10-2016-0181588, filed on Dec. 28, 2016, which is hereby incorporated by reference in its entirety for all purposes as if fully set forth herein.

BACKGROUND

Field of the Disclosure

The present disclosure relates to a display device, and more particularly, to a liquid crystal display device including an antistatic structure.

Description of the Background

With the development of a variety of portable electronic devices, such as mobile communication terminals and notebook computers, there is an increasing demand for flat panel display devices applied thereto.

Studies have been conducted on a flat panel display device, such as a liquid crystal display device, a plasma display panel, a field emission display device, a light emitting diode display device, an organic light emitting diode display device, and the like.

Among these display devices, a liquid crystal display (LCD) device is a device that includes an array substrate including a thin film transistor, an upper substrate including a color filter and/or a black matrix, and a liquid crystal layer formed therebetween, and displays an image by adjusting the alignment of the liquid crystal layer according to an electric field applied between both electrodes in a pixel region to thereby adjust the transmittance of light.

When an LCD device is manufactured or when a manufactured LCD device is used, static electricity may be generated on various metal patterns of an array substrate, so that a large amount of charges may flow into a pixel region of the display device. Such charges may possibly cause damage to pixels.

Accordingly, various types of electrostatic discharge (ESD) circuits may be formed in a portion in a non-display area of an array substrate of the LCD device to block or prevent the flow of overcurrent caused by static electricity.

Particularly, a common electrode ESD circuit for discharging static electricity generated from a common voltage line (Vcom Line) for applying a common voltage (Vcom) to pixels and a data line ESD circuit for discharging static electricity generated from a data line (DL) for supplying a source voltage to the pixels may be provided.

In this structure, static electricity generated from the common voltage line or the common electrode may be likely to flow into the data line, causing damage to the pixels.

SUMMARY

The present disclosure is to solve the foregoing problems in the prior art, and an aspect of the present disclosure is to provide a liquid crystal display (LCD) device including an antistatic structure.

Another aspect of the present disclosure is to provide an LCD device including an antistatic structure that is capable of preventing static electricity, which is generated from a common voltage line pattern, from flowing into a display area of a display panel.

Still another aspect of the present disclosure is to provide an LCD device including an antistatic structure that is capable of discharging static electricity generated from a common voltage pattern by floating a first electrostatic discharge (ESD) circuit from a common voltage line and electrically connecting the first ESD circuit to a common voltage jumping pattern which connects the common voltage line with a common electrode, the LCD device including the first ESD circuit to prevent static electricity generated from the common voltage and a second ESD circuit to prevent static electricity generated from a data line.

Yet another aspect of the present disclosure is to provide an LCD device in which a common voltage jumping pattern connected to an ESD circuit for a common voltage pattern is formed in a dual metal-layer structure, thereby improving the performance of discharging static electricity generated from the common voltage pattern.

To achieve the foregoing aspects, an LCD device according to the present aspect may be configured to include: a plurality of pixels configured to include at least one thin film transistor disposed at an intersection of a gate line (GL) and a data line (DL), a pixel electrode, and a common electrode; at least one common voltage line configured to apply a common voltage to the common electrode; a common voltage jumping pattern configured to electrically connect the common voltage line with the common electrode; and a first ESD circuit configured to have one end electrically connected to the common voltage jumping pattern. Here, another end of the first ESD circuit may be electrically connected to one of the common voltage lines.

The LCD device may further include a second ESD circuit configured to have one end connected to the data line and another end electrically connected to one of the common voltage lines.

The common voltage jumping pattern may include a plurality of contact holes to electrically connect a gate metal pattern, which is formed of the same layer as the common voltage line, with a common electrode pattern layer, which is formed of the same layer as the common electrode.

The common voltage jumping pattern may have a dual metal-layer structure including a first jumping pattern portion, which electrically connects a gate metal pattern formed of the same layer as the common voltage line with a common electrode pattern layer formed of the same layer as the common electrode, and a second jumping pattern portion, which electrically connects a source/drain metal pattern formed of the same layer as the data line with the common electrode pattern layer.

A plurality of first contact holes, which allows a gate insulating layer and at least one passivation layer to be open to expose a gate metal layer, may be disposed on the first jumping pattern portion forming the dual metal-layer structure, and a plurality of second contact holes, which allows at least one passivation layer to be open to expose a source/drain metal layer, may be disposed on the second jumping pattern portion. The contact holes may be repeatedly formed at regular intervals.

The first ESD circuit may include a first transistor, a second transistor, and a third transistor, which are connected to each other.

Aspects of the present disclosure to be described may provide an antistatic structure that is capable of preventing static electricity, which is generated from a common voltage line pattern, from flowing into a display area of a display panel.

Specifically, in an LCD device including a first ESD circuit to prevent static electricity generated from the common voltage pattern and a second ESD circuit to prevent static electricity generated from a data line, the first ESD circuit is floated from a common voltage line and is electrically connected to a common voltage jumping pattern which connects the common voltage line with a common electrode, thereby properly discharging static electricity generated from the common voltage pattern.

In particular, the common voltage jumping pattern connected to an ESD circuit for the common voltage pattern is formed in a dual metal-layer structure, thereby improving the performance of discharging static electricity generated from the common voltage pattern.

BRIEF DESCRIPTION OF THE DRAWINGS

The above and other objects, features and advantages of the present disclosure will be more apparent from the following detailed description taken in conjunction with the accompanying drawings, in which.

DETAILED DESCRIPTION

Hereinafter, some aspects of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

In addition, terms, such as first, second, A, B, (a), (b) or the like may be used herein when describing components of the present disclosure. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

Figure 1:
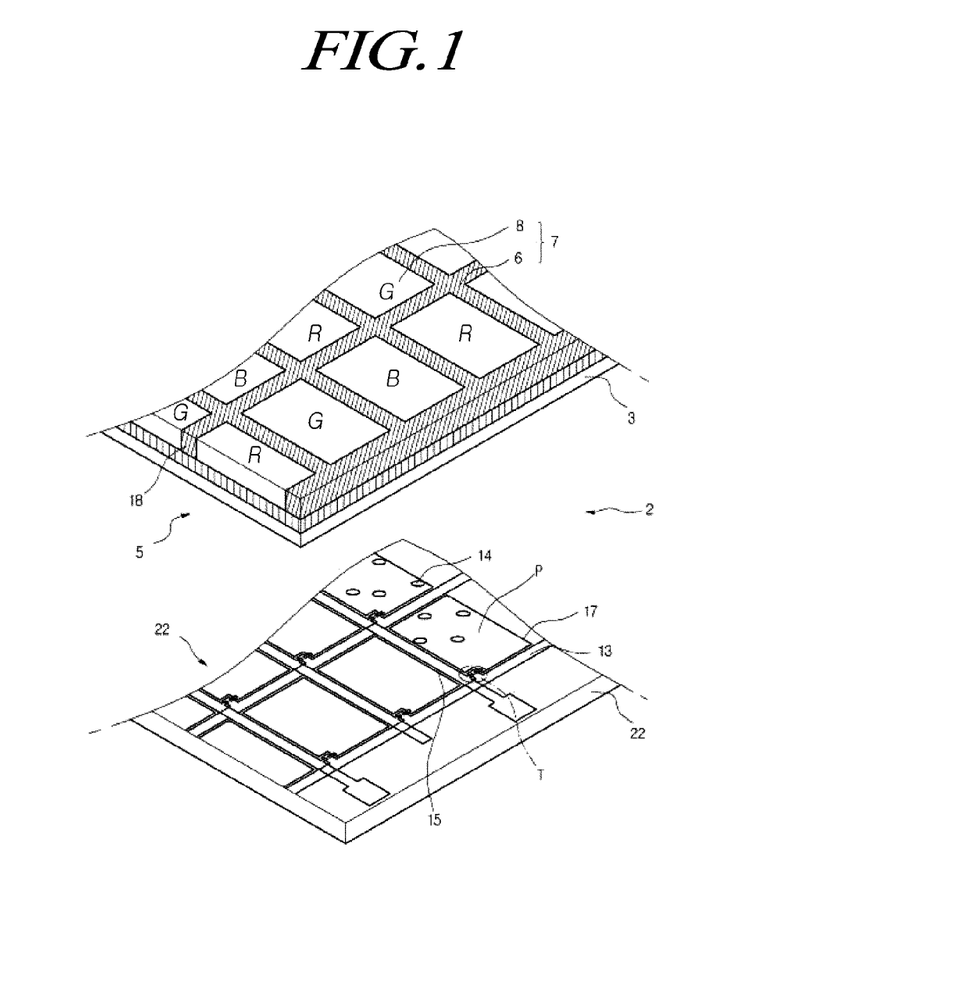
FIG. 1 illustrates a display panel of a liquid crystal display (LCD) device to which the present aspect is applied.

FIG. 1 illustrates a display panel of a liquid crystal display (LCD) device to which the present aspect is applied.

As illustrated in FIG. 1, a liquid crystal panel 2 includes an upper substrate 5 on which a color filter 7 including a black matrix 6 and sub-color filters (R, G, and B) 8 and a transparent common electrode 18 disposed on the color filter 7 are formed and an array substrate (or lower substrate) 22 on which a pixel electrode 17 formed in a pixel region P and an array wiring including a thin film transistor T are formed. Liquid crystal 14 fills a gap between the upper substrate 5 and the lower substrate 22.

The common electrode 18 may be formed on the lower substrate (or array substrate) but not on the upper substrate, as will be described in FIG. 8.

Figure 2:
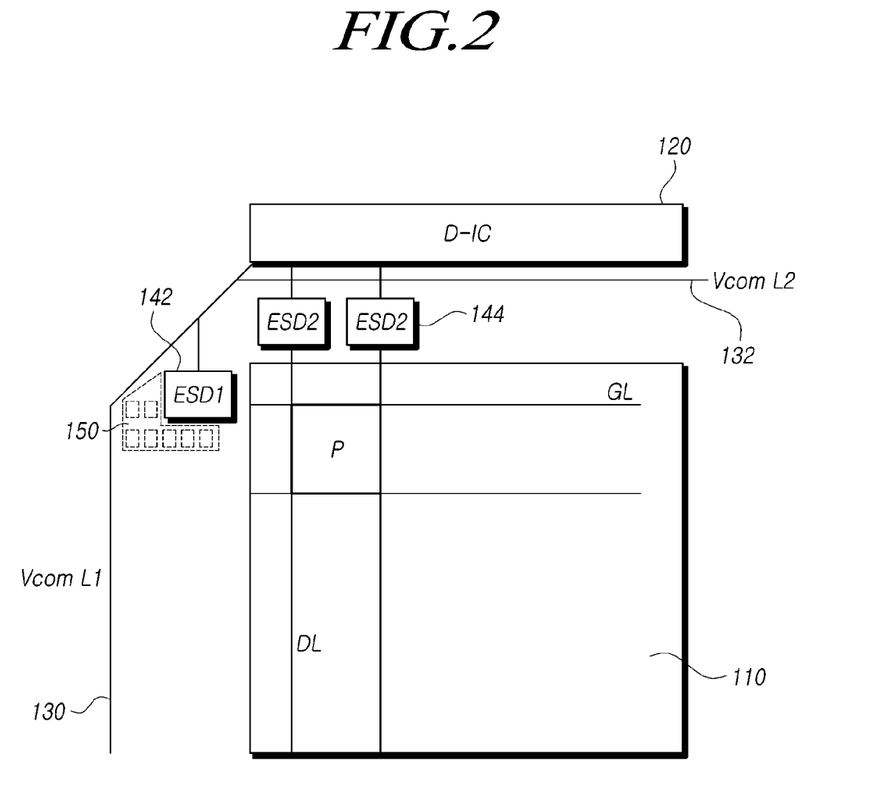
FIG. 2 is a plan view of an LCD device to which the present aspect is applied.

FIG. 2 is a plan view of an LCD device to which the present aspect is applied.

An LCD panel to which the present aspect is applied is divided into a display area AA, in which an image is displayed, and a non-display area NA, in which no image is displayed.

In the display area AA, a plurality of gate lines GL and a plurality of data lines DL, which define a pixel region, are arranged, a thin film transistor (TFT) as a switching element is formed at each intersection of the gate lines and the data lines, and a pixel electrode (not shown) electrically connected to the TFT is formed.

In the non-display area NA, a driver IC (D-IC) 120 that supplies a scan signal to the plurality of gate lines GL and supplies a data signal to the plurality of data lines DL is provided. Further, a connection line (not shown) to connect the driver IC to the plurality of gate lines GL and the plurality of data lines DL is arranged in the non-display area NA.

A plurality of ESD circuits 142 and 144 is formed in the display area AA or the non-display area NA to protect the plurality of gate lines GL or data lines DL.

First and second common voltage lines Vcom L1 and Vcom L2 are formed in the outside of the LCD panel and are electrically connected to the ESD circuits 142 and 144 to protect the plurality of gate lines GL or data lines DL.

As illustrated in FIG. 2, the ESD circuits may include a first ESD circuit (ESD1) 142 connected to the common voltage lines to discharge static electricity generated from a common voltage line pattern and a second ESD circuit (ESD2) 144 connected to the data lines to discharge static electricity generated from a data line pattern.

As will be described in more detail with reference to FIG. 3, the first ESD circuit (ESD1) 142 and the second ESD circuit (ESD2) 144 are electrically connected.

A common voltage jumping pattern 150 to electrically connect the common voltage lines and a common electrode in the pixel region is formed in a portion of the non-display area of the LCD panel.

The common voltage jumping pattern 150 is a structure for transferring a common voltage signal Vcom, output from the driver IC along the common voltage lines, to the common electrode in the pixel region, and may include a gate metal pattern forming the common voltage lines and a plurality of contact holes to connect the common electrodes formed above the gate metal pattern via one or more insulating layers.

In this LCD panel, when the driver IC 120 outputs a common voltage, the common voltage is applied to the common electrode in the pixel region through the common voltage jumping pattern 150, simultaneously with a source signal or a data signal output from the driver IC being supplied to the data lines, and a gate signal or a scan signal being applied to the gate lines.

Then, the TFT in the pixel region is selectively switched by the gate signal and the source signal to apply a driving voltage to the pixel electrode, and the alignment of liquid crystals is changed by a potential difference between the driving voltage of the pixel electrode and the common voltage of the common electrodes, thereby displaying an image.

Figure 3:
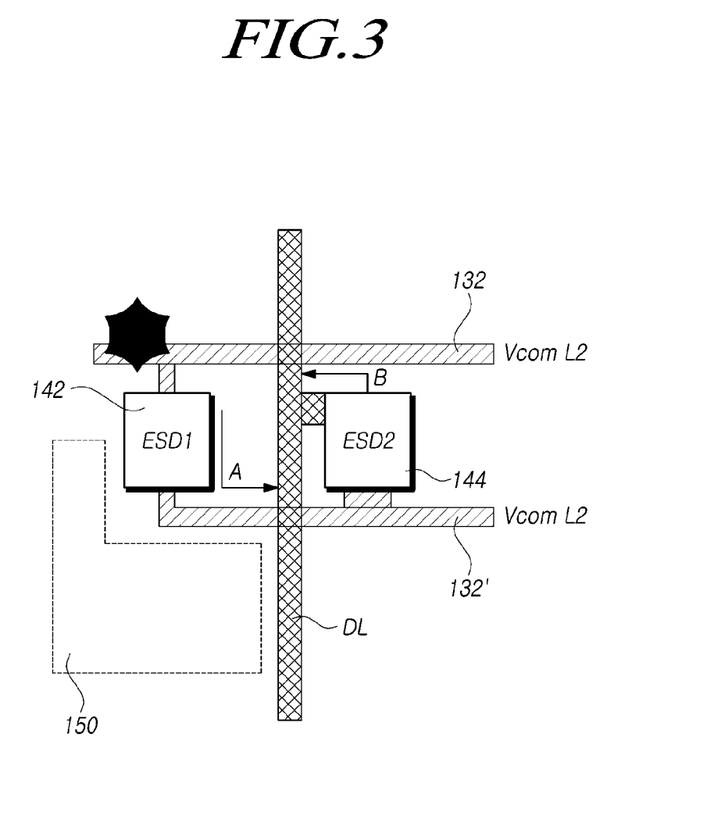
FIG. 3 is an enlarged view of an antistatic structure for the LCD device illustrated in FIG. 2, which shows a phenomenon in which static electricity generated from a common voltage pattern flows into a panel along a data line.

FIG. 3 is an enlarged view of an antistatic structure for the LCD device illustrated in FIG. 2, which shows a phenomenon in which static electricity generated from a common voltage pattern flows into the panel along a data line.

As described above, the LCD panel illustrated in FIG. 2 may include one or more ESD circuits to properly discharge, to the outside, static electricity generated from various metal patterns in the manufacturing process of the panel or the like. In FIG. 3, an ESD circuit may include a first ESD circuit (ESD1) 142 connected to a common voltage line to discharge static electricity generated from a common voltage line pattern and a second ESD circuit (ESD2 144) connected to a data line to discharge static electricity generated from a data line pattern.

Here, the first ESD circuit (ESD1) 142 and the second ESD circuit (ESD2) 144 are electrically connected.

More specifically, as illustrated in FIG. 3, two second common voltage lines (Vcom L2) 132 and 132' are disposed in one direction of the display panel, and the first ESD circuit (ESD1) 142 is connected to an upper second common voltage line 132 at one end thereof and is connected to a lower second common voltage line 132' at the other end thereof.

The second ESD circuit (EDS2) 144 is connected to the data line DL at one end thereof and is connected to one of the two second common voltage lines 132 and 132' at the other end thereof.

The first ESD circuit 142 and the second ESD circuit 144 include two or more switching elements, such as transistors. Each of the switching elements has a characteristic of being damaged when a certain level or higher of current or voltage is applied thereto.

Therefore, when great charges due to static electricity are input from one end of the first ESD circuit and the second ESD circuit, a transistor of the ESD circuits absorbs the static electricity and is damaged, thus preventing the static electricity from flowing into the data line or the common voltage line connected to the ESD circuits.

In the antistatic structure illustrated in FIG. 3, the first ESD circuit 142 and the second ESD circuit 144 are electrically connected to each other via the second common voltage line 132'.

Therefore, when static electricity is generated from the common voltage pattern or a common electrode, a large amount of electrostatic charges may flow into both the first ESD circuit 142 and the second ESD circuit 144.

Particularly, in this case, since the data line has a smaller electrical resistance than a common voltage jumping pattern 150 disposed around the common voltage lines, the static electricity generated from the common voltage pattern may flow more into the second ESD circuit 144 and the data line DL.

That is, as illustrated in FIG. 3, the static electricity generated from the common voltage line pattern or the like flows into the data line through path A and path B in FIG. 3, causing damage to pixels in the panel.

Particularly, unlike a typical display panel with an aspect ratio of 4:3 or 16:9, the aspect ratio of a horizontal display panel for advertising may be changed to up to 58:9.

In this horizontal display panel, the length of a data line extending in the vertical direction of the panel is relatively short, so that the resistance of the data line becomes significantly low. As a result, the static electricity generated from the common voltage pattern is more likely to flow into the data line.

Accordingly, an aspect of the present disclosure proposes an antistatic structure for minimizing a problem that static electricity generated from a common voltage pattern flows into a data line in an LCD panel including a first ESD circuit for the common voltage pattern.

Figure 4:
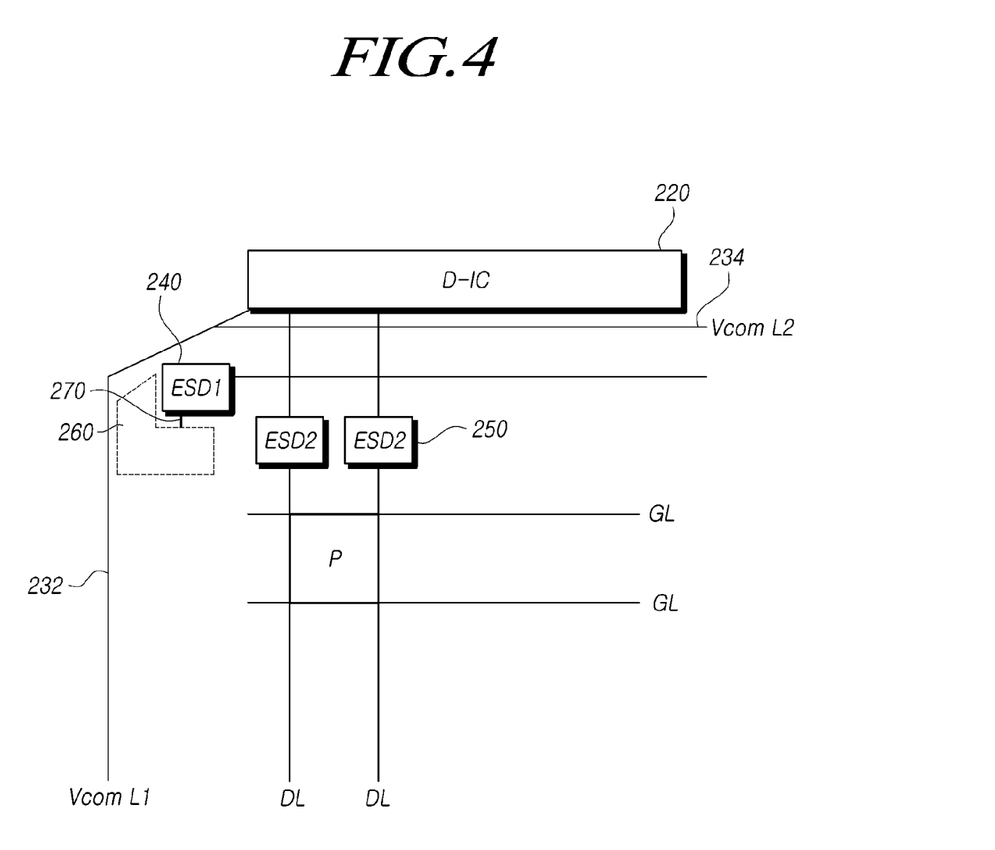
FIG. 4 is a plan view of an LCD device according to the present aspect.
Figure 5:
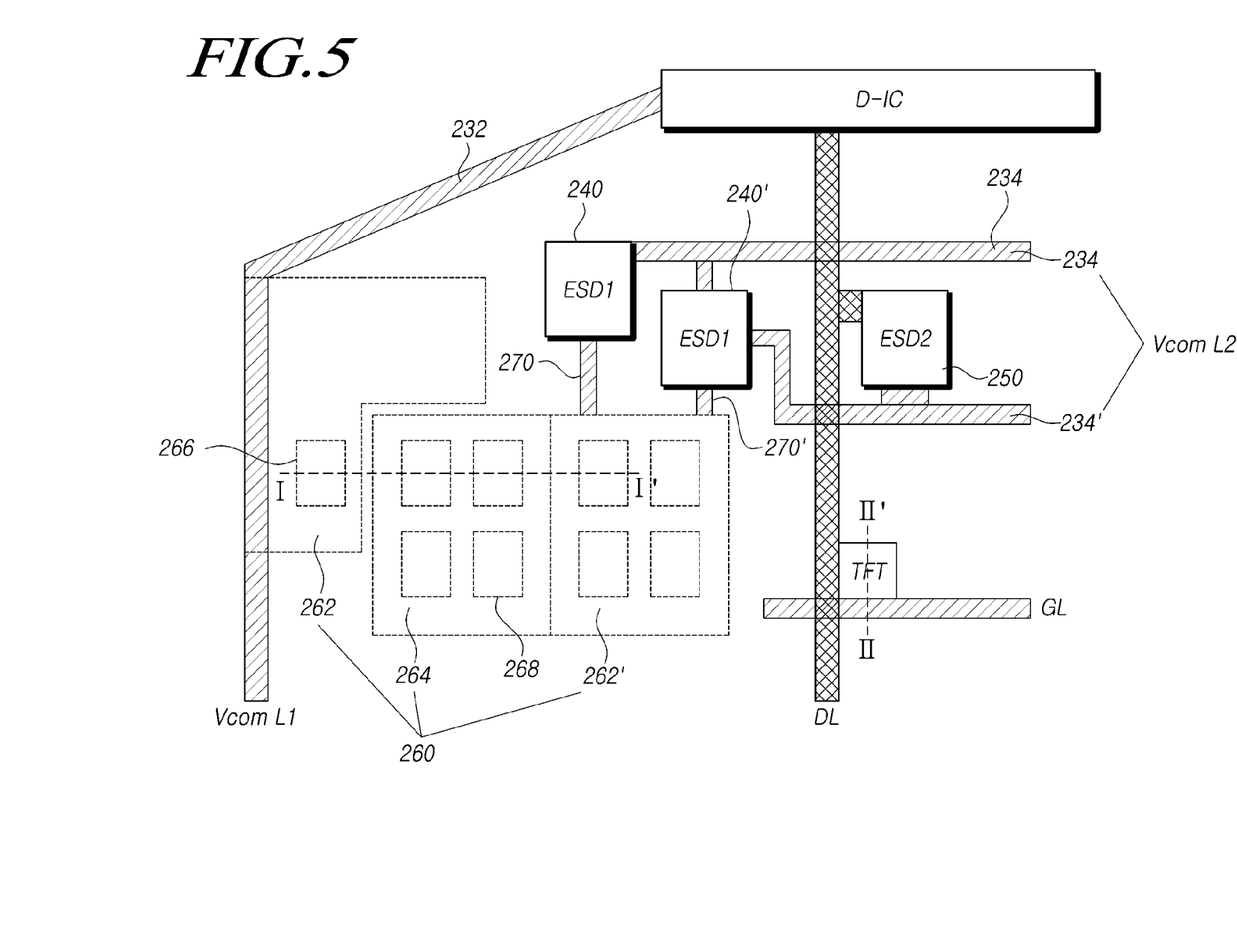
FIG. 5 is an enlarged view of an antistatic structure of the LCD device according to the present aspect.

FIG. 4 is a plan view of an LCD device according to the present aspect, and FIG. 5 is an enlarged view of an antistatic structure of the LCD device according to the present aspect.

The LCD device according to the present aspect includes a display panel including a display area and a non-display area. A plurality of gate lines GL and a plurality of data lines DL are disposed in the display area, and a pixel is formed in an intersection area of each gate line and each data line.

Each pixel region includes one or more TFTs, which are switched by a gate drive signal or a scan signal applied to the gate line and a source signal or a data signal applied to the data line, a pixel electrode to which a drive voltage is applied, and a common electrode to which a common voltage is applied.

A detailed configuration of the pixel region will be described below in detail with reference to FIGS. 6A and 6B.

One or more common voltage lines (Vcom L1 and L2) 232 and 234 for applying a common voltage to a common electrode are formed in the non-display area of the display panel.

The common voltage lines may include a first common voltage line Vcom L1 232, which extends from a driver IC 220 provided at one side of the display device and extends in a first direction (vertical direction) of the display panel, and a second common voltage line (Vcom L2) 234, which extends in a second direction (horizontal direction) that is perpendicular to the first direction.

The common voltage lines 232 and 234 may be formed of the same material in the same layer as a gate metal layer.

Further, a common voltage jumping pattern 260 is disposed near the common voltage lines 232 and 234 to electrically connect the common voltage lines and the common electrode of the pixel. The display panel includes a first ESD circuit 240 having one end electrically connected to the common voltage jumping pattern 260.

The first ESD circuit 240 is a circuit to discharge static electricity generated from the common voltage lines to the outside or to protect the display panel from static electricity generated from the common voltage lines. A detailed configuration of the first ESD circuit 240 will be described in detail with reference to FIG. 8.

That is, comparing with the aspects illustrated in FIGS. 2 and 3, in the antistatic structure according to the aspect of FIG. 4, one end of the ESD circuit provided against static electricity generated from the common voltage lines or the like is connected to the common voltage jumping pattern 260, instead of being connected to the first common voltage line 232.

With this type of antistatic structure, static electricity generated from the common voltage lines is absorbed while passing through the common voltage jumping pattern, thereby minimizing static electricity flowing into the data line and a second ESD circuit for protecting the data line, which will be described in detail with reference to FIG. 7.

According to the present aspect, the display panel further includes a second ESD circuit (ESD2) 250, one end of which is connected to the data line and the other end of which is electrically connected to one of the common voltage lines.

The second ESD circuit 250 is for discharging static electricity generated from the data line or for preventing static electricity generated from the data line from flowing into the pixel region in the display panel along the data line. As illustrated in FIG. 5, one end of the second ESD circuit 250 may be connected to the data line, and the other end thereof may be connected to one of the second common voltage lines (Vcom L2) 234.

The common voltage jumping pattern 260 is formed near the common voltage lines to electrically connect the common voltage lines 232 and 234 with a common electrode layer of the pixel, and may include a plurality of contact holes 266 and 268 to electrically connect the gate metal layer forming the common voltage lines with a common electrode pattern layer forming the common electrode.

The common voltage jumping pattern 260 according to the present aspect may have a dual metal-layer structure including a first jumping pattern portion 262, which electrically connects the gate metal layer forming the common voltage lines with the common electrode pattern layer forming the common electrode, and a second jumping pattern portion 264, which electrically connects a source/drain metal layer forming the data line with the common electrode pattern layer.

Figure 6A:
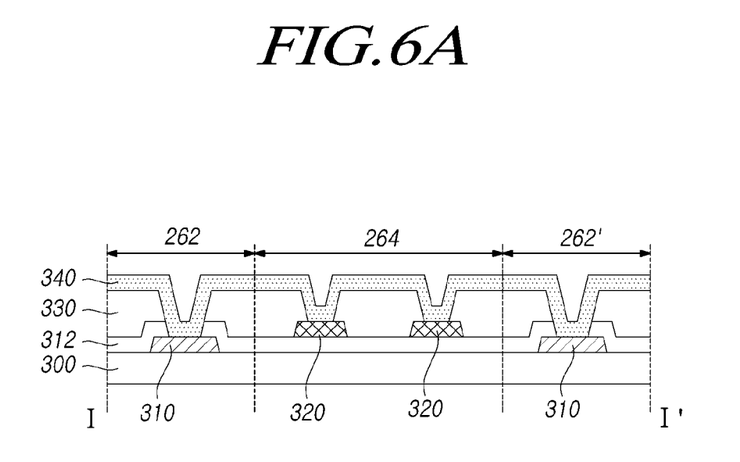
FIGS. 6A and 6B illustrate a cross-sectional view of a common voltage jumping pattern of a dual metal layer which is applied to an antistatic structure and a cross-sectional view of a thin film transistor region according to the present aspect.

In detail, as illustrated in FIGS. 5 and 6A, a plurality of first contact holes 266, which allows a gate insulating layer 312 and one or more passivation layers 330 to be open to expose the gate metal layer, may be formed on the first jumping pattern portion 262, and a plurality of second contact holes 268, which allows one or more passivation layers 330 to be open to expose the source/drain metal layer, may be formed on the second jumping pattern portion 264.

Here, the plurality of first contact holes 266 formed on the first jumping pattern portion 262 and the plurality of second contact holes 268 formed on the second jumping pattern portion 264 are repeatedly formed at regular intervals, so that the contact holes may form a lattice structure or a mesh structure.

Hereinafter, a stacked structure of the common voltage jumping pattern 260 is described with reference to FIGS. 6A and 6B.

Figure 6B:
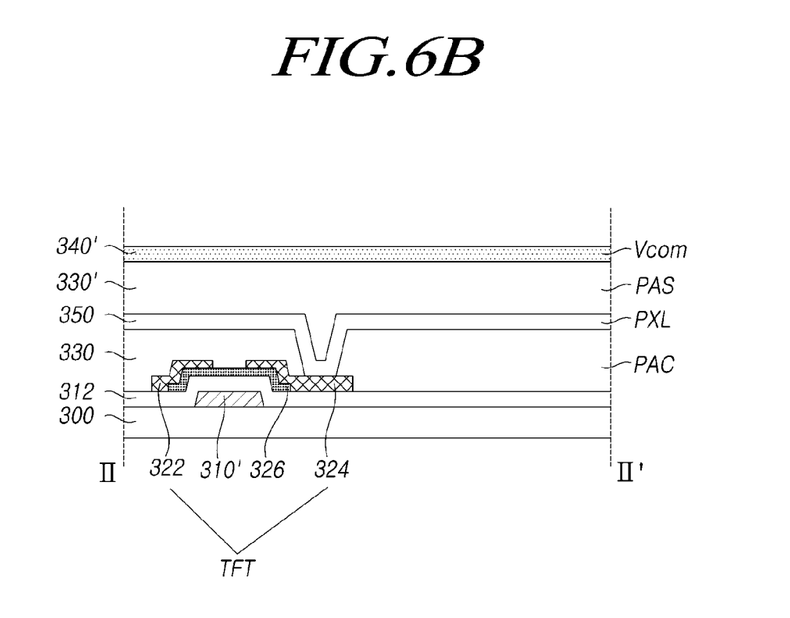

FIGS. 6A and 6B illustrate a cross-sectional view of the common voltage jumping pattern of a dual metal layer which is applied to an antistatic structure and a cross-sectional view of a TFT region according to the present aspect.

FIG. 6A is a cross-sectional view of the common voltage jumping pattern taken along line I-I' of FIG. 5, and FIG. 6B is a cross-sectional view of a pixel region taken along line II-II' of FIG. 5.

In the present disclosure, for convenience, a side of an array substrate on which a gate electrode is formed is referred to as a lower side, and a side on which a common electrode is formed is referred to as an upper side.

That is, an upper substrate (or color filter substrate) side of a display panel is defined as an upper side and an array substrate side is defined as a lower side.

First, a gate metal pattern 310 is formed on a substrate 300 of the same layer as a common voltage line, and a gate insulating layer 312 is deposited thereon.

Next, a source/drain metal pattern 320 is formed on the gate insulating layer 312, and a lower passivation layer (PAC) 330 is deposited thereon.

Here, the gate metal pattern 310 is formed of the first jumping pattern portion 262, and the source/drain metal pattern 320 is formed of the second jumping pattern portion 264 region.

Next, using a mask and a photolithography process, a plurality of first contact holes 266, which allows the gate insulating layer 312 and the lower passivation layer 330 to be open to expose a gate metal layer, is formed in the first jumping pattern portion 262, and a plurality of second contact holes 268, which allows one or more lower passivation layers 330 to be open to expose a source/drain metal layer, is formed in the second jumping pattern portion 264.

A common electrode pattern layer 340 having conductivity is formed on the entire surface.

As a result, as illustrated in FIG. 6A, the gate metal pattern 310 formed of the same layer as the common voltage line is electrically connected to a common electrode (340' in FIG. 6B) formed in the pixel region through the common electrode pattern layer 340.

Therefore, a common voltage signal applied to the common voltage line is transmitted to the common electrode in the pixel.

As illustrated in FIGS. 5 and 6A, the common voltage jumping pattern has a double metal-layer structure including the source/drain metal pattern 320 in addition to the gate metal pattern 310, thus further effectively blocking static electricity generated from the common voltage line.

That is, with the double metal-layer structure, when electrostatic charges generated from the first common voltage line (Vcom L1) 232 flow into the common voltage jumping pattern and are transferred, the electrostatic charges are transferred to the source/drain metal pattern 320 as well as the gate metal pattern 310 to be absorbed or discharged, thereby increasing antistatic effects.

That is, when the common voltage jumping pattern 260 has a double metal-layer structure, the electrical resistance of the common voltage jumping pattern 260 is relatively increased as compared with when the common voltage jumping pattern 260 has a single metal layer, and static electricity generated from the common voltage line is absorbed via the common voltage jumping pattern having great electrical resistance, thus more effectively protecting the panel from damage.

As illustrated in FIG. 5, one end of the first ESD circuit (ESD1) 240 is connected to the common voltage jumping pattern 260 via a connection wire 270 formed in the same layer as the gate metal layer.

That is, the gate metal pattern 310 formed of the first jumping pattern portion 262' of the common voltage jumping pattern 260 and the connection wire 270 may be patterned in the same gate metal layer.

As illustrated in FIG. 5, two first ESD circuits 240 and 240' may be provided, one end of which is connected to the common voltage jumping pattern 260 via connection wires 270 and 270' and the other end of which is connected to two second common voltage lines (Vcom L2) 234 and 234' extending in the horizontal direction (second direction) of the pattern.

One end of the second ESD circuit 250 may be connected to the data line DL, and the other end thereof may be connected to one of the two second common voltage lines (Vcom L2) 234 and 234'.

As illustrated in FIG. 6B, the pixel region may include a gate line, a gate electrode 310' extending from the gate line, the gate insulating layer 312 formed above the gate electrode in the entire area including a display area and a non-display area, and a semiconductor pattern 326 formed on the gate insulating layer 312 to overlap part of the gate electrode 310'.

The semiconductor pattern 326 forms an active region of a TFT and may be formed of amorphous silicon (a-Si) or oxide semiconductors of zinc oxides (ZnO), for example, Indium Gallium Zinc Oxide (IGZO), Zinc Tin Oxide (ZTO), Zinc Indium Oxide (ZIO), or the like, without being limited thereto.

Further, the pixel region may include a data line intersecting with the gate line with the gate insulating layer (GI) 312 interposed therebetween, and the TFT including a source electrode 322 extending from the data line and a drain electrode 324 facing the source electrode 322. The pixel region includes a pixel electrode 350 that is formed in the entire pixel region defined by the intersection of the gate line and the data line and becomes in contact with the drain electrode 324 of the TFT.

An organic passivation layer (PAC) functioning as an interlayer insulating layer and lower passivation layer 330 is formed on the gate insulating layer (GI) 312 on which the data line and the TFT are formed.

The organic passivation layer forming the lower passivation layer 330 may be formed of photo-acryl, acrylate, polyamide, benzocyclobutene (BCB), or the like, without being limited thereto.

Next, an inorganic passivation layer (PAS) functioning as an interlayer insulating layer and upper passivation layer 330' is formed on the pixel electrode 350.

The inorganic passivation layer PAS forming the upper passivation layer 330' may be formed of an inorganic insulating material, such as silicon nitride ($SiN_x$) and silicon oxide ($SiO_2$), without being limited thereto.

A common electrode 340' is formed on the inorganic passivation layer (PAS).

Here, the gate metal layer of the gate line or the gate electrode or the source/drain metal layer may include a metal material having low resistance, for example, one or two materials among aluminum (Al), aluminum alloy (AlNd), copper (Cu), copper alloy, molybdenum (Mo), and molybdenum alloy (MoTi).

In the present aspect, the common electrode pattern layer 340 forming the common electrode 340' included in the pixel and the common voltage jumping pattern 260 may be a transparent electrode, and may be formed of a transparent conductive material having a relatively large work function value, for example, metal oxides, such as Indium Tin Oxide (ITO) or Indium Zinc Oxide (IZO), and combinations of metals and oxides, such as ZnO:Al or SnO2:Sb.

The gate insulating layer (GI) 312 and the upper passivation layer 330' may be formed of an inorganic insulating material, such as silicon oxide ($SiO_2$) and silicon nitride ($SiN_x$), without being limited thereto. The gate insulating layer (GI) 312 and the upper passivation layer 330' may also be formed of other electrically insulating materials.

Although the pixel illustrated in FIG. 6B is a common electrode (Vcom)-On-Top (VOT) type in which the common electrode is disposed on the uppermost layer of the array substrate, the present aspect is not limited thereto. A pixel electrode (Pixel)-On-Top (POT) type, in which the pixel electrode is disposed on the uppermost layer of the array substrate, may also be applied to the pixel.

Figure 7:
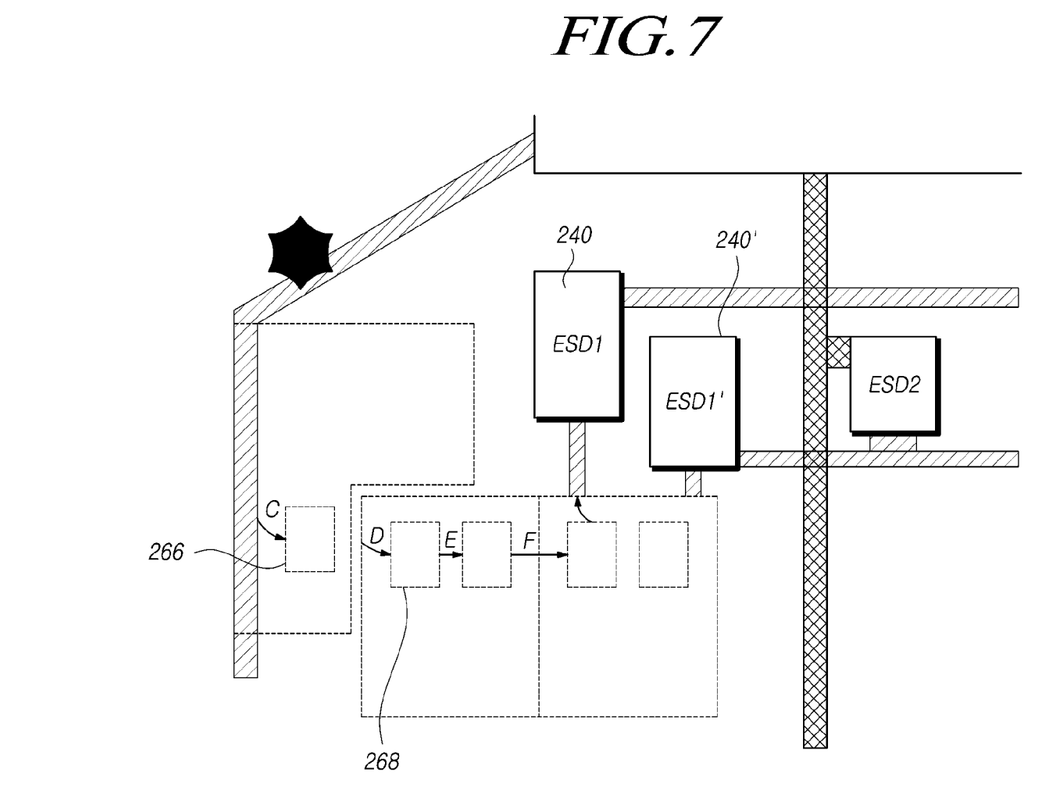
FIG. 7 illustrates an electrostatic transfer characteristic by the antistatic structure according to the present aspect.

FIG. 7 illustrates an electrostatic transfer characteristic by the antistatic structure according to the present aspect.

As illustrated in FIG. 7, with the antistatic structure according to the present aspect, when static electricity is generated from the first common voltage line (Vcom L1) 232, the static electricity is first introduced into the common voltage jumping pattern 260 and is transferred.

During this process, some of a plurality of contact holes formed in the common voltage jumping pattern are exposed to strong electric charges to be damaged, while absorbing the static electricity.

That is, as indicated by paths C, D, E, and F in FIG. 7, since static electricity generated from the common voltage line is transferred, being absorbed to some extent, while damaging contact holes, starting from the closest contact hole, the amount of static electricity gradually decreases from path C to path F.

Therefore, the amount of static electricity flowing into the first ESD circuit 240 connected to the common voltage jumping pattern is reduced, and thus the amount of static electricity flowing into the data line and the second ESD circuit connected to the data line is also reduced.

Here, since the plurality of contact holes is arranged in a lattice form on the common voltage jumping pattern portion, and the gate metal pattern and the common electrode pattern layer are electrically connected via all the contact holes, even though some of the contact holes are damaged by static electricity, a signal may be properly transmitted through the other contact holes.

That is, it is possible to properly transmit a signal (a common voltage signal or the like) while maintaining antistatic effects.

Figure 8:
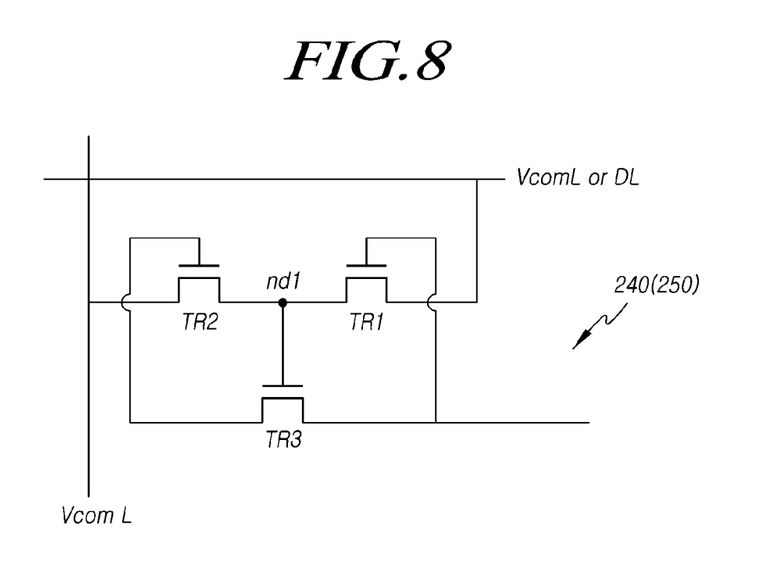
FIG. 8 illustrates an example of an electrostatic discharge (ESD) circuit used for the present aspect.

FIG. 8 illustrates an example of an ESD circuit used for the present aspect.

As illustrated in FIG. 8, a first ESD circuit 240 and a second ESD circuit 250 used in the present aspect may include three transistors TR1, TR2, and TR3.

The first ESD circuit 240 and the second ESD circuit 250 used in the present aspect include first to third transistors TR1 to TR3 which are connected to each other.

Specifically, a drain terminal of the first transistor TR1 is connected to one of common voltage lines in the first ESD circuit and is connected to a data line in the second ESD circuit. A source terminal of the first transistor TR1 is connected to a drain terminal of the second transistor TR2.

A source terminal of the second transistor TR2 is connected to one of the common voltage lines, a gate terminal of the first transistor TR1 is connected to a drain terminal of the third transistor TR3, and a gate terminal of the second transistor TR2 is connected to a source terminal of the third transistor TR3.

A gate terminal of the third transistor TR3 is connected to a first node nd1 connected to the source terminal of the first transistor TR1 and the drain terminal of the second transistor TR2.

In these ESD circuits, in a normal state in which no high-voltage static electricity is introduced from the outside, both ends of the first ESD circuit 240 are equipotential (are supplied with a common voltage), while both ends of the second ESD circuit 250 are supplied with a common voltage (Vcom) and a data drive voltage and thus have a potential difference.

That is, in the second ESD circuit 250, the drain terminal of the first transistor TR1 and the source terminal of the second transistor TR2 are supplied with different voltages.

The first to third transistors TR1 to TR3 forming the ESD circuits have an operational limit.

Accordingly, when high-voltage static electricity exceeding the operational limit of each transistor flows into the ESD circuits, the transistor absorbs the static electricity to be damaged, thus preventing the static electricity from flowing into pixels via the data line or a common voltage jumping pattern.

The first ESD circuit 240 and the second ESD circuit 250 according to the present aspect do not necessarily have the configuration shown in FIG. 8 but may employ different types of ESD circuit configurations.

However, even though different types of ESD circuits are used, one end of the first ESD circuit that prevents static electricity generated from the common voltage line needs to be electrically connected to the common voltage jumping pattern, not to the common voltage line.

As described above, according to the aspect of the present disclosure, static electricity generated from a common voltage line pattern may be prevented from flowing into a display area of a display panel.

Specifically, in an LCD device including a first ESD circuit to prevent static electricity generated from the common voltage jumping pattern and a second ESD circuit to prevent static electricity generated from a data line, the first ESD circuit is floated from a common voltage line and is electrically connected to a common voltage jumping pattern which connects the common voltage line with a common electrode, thereby properly discharging static electricity generated from the common voltage pattern.

In particular, the common voltage jumping pattern connected to an ESD circuit for the common voltage pattern is formed in a dual metal-layer structure, thereby improving the performance of discharging static electricity generated from the common voltage pattern.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Therefore, the aspects disclosed in the present disclosure are intended to illustrate the scope of the technical idea of the present disclosure, and the scope of the present disclosure is not limited by the aspect. The scope of the present disclosure shall be construed on the basis of the accompanying claims in such a manner that all of the technical ideas included within the scope equivalent to the claims belong to the present disclosure.

What is claimed is:

1. A liquid crystal display device comprising:
   a plurality of pixels comprising a pixel electrode, a common electrode and at least one thin film transistor disposed at an intersection of a gate line (GL) and a data line (DL);
   at least one common voltage line configured to apply a common voltage to the common electrode;
   a common voltage jumping pattern electrically connecting the at least one common voltage line and the common electrode, wherein the common voltage jumping pattern is disposed in a portion of a non-display area; and
   a first electrostatic discharge (ESD) circuit having one end electrically connected to the common voltage jumping pattern.

2. The liquid crystal display device of claim 1, further comprising a second ESD circuit having one end electrically connected to the data line and another end electrically connected to one of the at least one common voltage lines.

3. The liquid crystal display device of claim 2, wherein the second ESD circuit prevents a static electricity generated from the data line or a static electricity generated from the data line from flowing into a pixel region.

4. The liquid crystal display device of claim 1, wherein the common voltage jumping pattern comprises a plurality of contact holes to electrically connect a gate metal pattern and a common electrode pattern layer.

5. The liquid crystal display device of claim 4, wherein the gate metal pattern is formed of the same layer as the common voltage line and the common electrode pattern layer is formed of the same layer as the common electrode.

6. The liquid crystal display device of claim 1, wherein the common voltage jumping pattern comprises a first jumping pattern portion electrically connecting a gate metal pattern and a common electrode pattern layer and a second jumping pattern portion electrically connecting a source/drain metal pattern and the common electrode pattern layer.

7. The liquid crystal display device of claim 6, wherein the source/drain metal pattern is formed of the same layer as the data line.

8. The liquid crystal display device of claim 6, wherein the first jumping pattern portion includes a plurality of first contact holes, which allows a gate insulating layer and at least one passivation layer to expose a gate metal layer, and the second jumping pattern portion includes a plurality of second contact holes, which allows the at least one passivation layer to expose a source/drain metal layer.

9. The liquid crystal display device of claim 1, wherein the first ESD circuit has another end electrically connected to one of the at least one common voltage lines.

10. The liquid crystal display device of claim 1, wherein the first ESD circuit comprises a first transistor, a second transistor, and a third transistor, which are connected to each other.

11. A liquid crystal display device comprising a plurality of pixels, a pixel electrode, a common electrode and a thin film transistor disposed at an intersection of a gate line and a data line, comprising:
    first and second common voltage lines configured to apply a common voltage to the common electrode;
    first and second common voltage jumping patterns electrically connecting the first and second common voltage lines and the common electrode; and
    first and second electrostatic discharge circuits, the first electrostatic discharge circuit having one end connected to the second common voltage jumping pattern and the other end connected to the second common voltage lines, the second electrostatic discharge circuit having one connected to the data line.

12. The liquid crystal display device of claim 11, further comprising a supplemental first electrostatic discharge circuits electrically connected to the second common voltage jumping pattern, the second common voltage line and a supplemental second common voltage line.

13. The liquid crystal display device of claim 11, wherein the first jumping pattern portion electrically connecting a gate metal pattern and a common electrode pattern layer and the second jumping pattern portion electrically connecting a source/drain metal pattern and the common electrode pattern layer.

14. The liquid crystal display device of claim 13, wherein the gate metal pattern is formed of the same layer as the first and second common voltage lines and the common electrode pattern layer is formed of the same layer as the common electrode.

15. The liquid crystal display device of claim 13, wherein the source/drain metal pattern is formed of the same layer as the data line.

16. The liquid crystal display device of claim 11, wherein the first jumping pattern portion includes a plurality of first contact holes allowing a gate insulating layer and at least one passivation layer to expose a gate metal layer, and the second jumping pattern portion includes a plurality of second contact holes allowing the at least one passivation layer to expose a source/drain metal layer.

17. The liquid crystal display device of claim 11, wherein the second electrostatic discharge circuit prevents a static electricity generated from the data line or a static electricity generated from the data line from flowing into a pixel region.

18. The liquid crystal display device of claim 11, wherein first and second common voltage jumping patterns comprises a dual metal-layer structure.

19. The liquid crystal display device of claim 11, wherein both ends of the first electrostatic discharge circuit are equipotential and both ends of the second electrostatic discharge circuit has a different potential.

20. The liquid crystal display device of claim 11, wherein the first electrostatic discharge circuit prevents a static electricity generated from the first and second common voltage jumping patterns.

* * * * *

UNITED STATES PATENT AND TRADEMARK OFFICE
CERTIFICATE OF CORRECTION

PATENT NO. : 10,503,035 B2
APPLICATION NO. : 15/682106
DATED : December 10, 2019
INVENTOR(S) : Jimin Yeom et al.

Page 1 of 1

It is certified that error appears in the above-identified patent and that said Letters Patent is hereby corrected as shown below:

In the Claims

In Claim 11,

Column 12, Line 58, the word "lines" should be changed to --line--.

Column 12, Line 59, the word --end-- should be inserted between "one" and "connected".

Signed and Sealed this
Nineteenth Day of August, 2025

Coke Morgan Stewart
*Acting Director of the United States Patent and Trademark Office*